United States Patent [19]
Lee

[11] Patent Number: 5,745,401
[45] Date of Patent: Apr. 28, 1998

[54] HIGH-SPEED PROGRAMMABLE READ ONLY MEMORY

[75] Inventor: Kang W. Lee, Allentown, Pa.

[73] Assignee: Lucent Technologies Inc., Murray Hill, N.J.

[21] Appl. No.: 800,346

[22] Filed: Feb. 14, 1997

[51] Int. Cl.$^6$ ................................................. G11C 7/00
[52] U.S. Cl. .............. 365/104; 365/189.02; 365/189.05; 365/207; 365/230.02
[58] Field of Search .......................... 365/104, 189.02, 365/230.02, 189.05, 230.08, 207

[56] References Cited

U.S. PATENT DOCUMENTS

| | | | |
|---|---|---|---|
| 4,447,893 | 5/1984 | Murakami | 365/104 |
| 4,489,399 | 12/1984 | Suzuki et al. | 365/104 |
| 5,550,782 | 8/1996 | Cliff et al. | 365/230.03 |

*Primary Examiner*—Do Hyun Yoo

[57] ABSTRACT

Each column in the memory array of transistors of a programmable read only memory (ROM) can be programmed in either a conventional mode or an inverted mode. In the conventional mode, each transistor is either programmed (i.e., connected to the corresponding bit line) or unprogrammed (i.e., left unconnected to the corresponding bit line). In this way, the programming mode can be selected, independently for each column, to limit the maximum number of transistors that can be programmed in any given column to one half of the total number of transistors in the column. As such, the total capacitance along a bit line is reduced and the access time is therefore also reduced, resulting in a faster ROM. The information as to which columns are encoded using which programming modes is contained in a component of the ROM. That programming-mode information is accessed when reading data out of the memory array to determine whether or not to invert the data for the various columns.

11 Claims, 9 Drawing Sheets

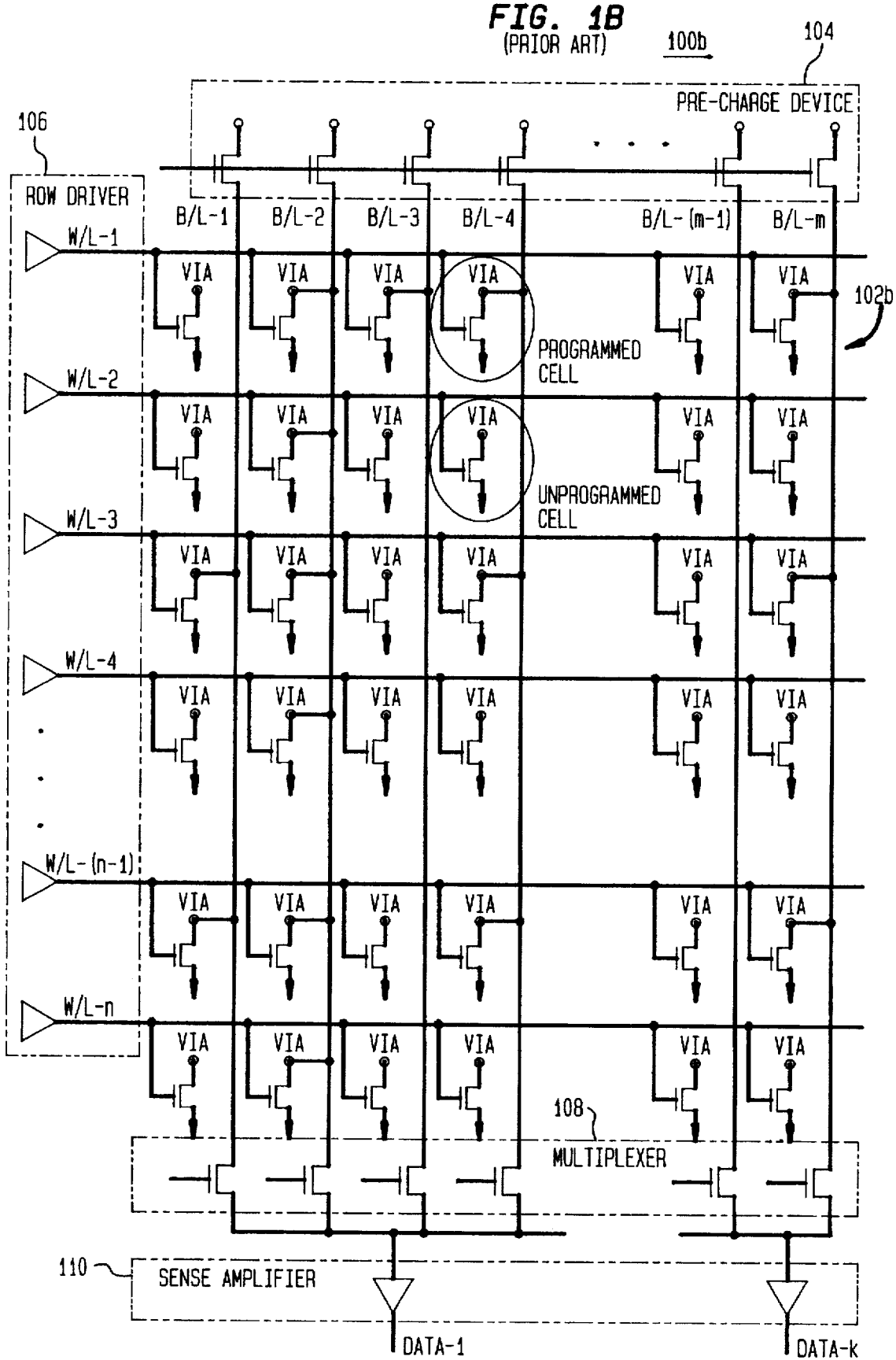

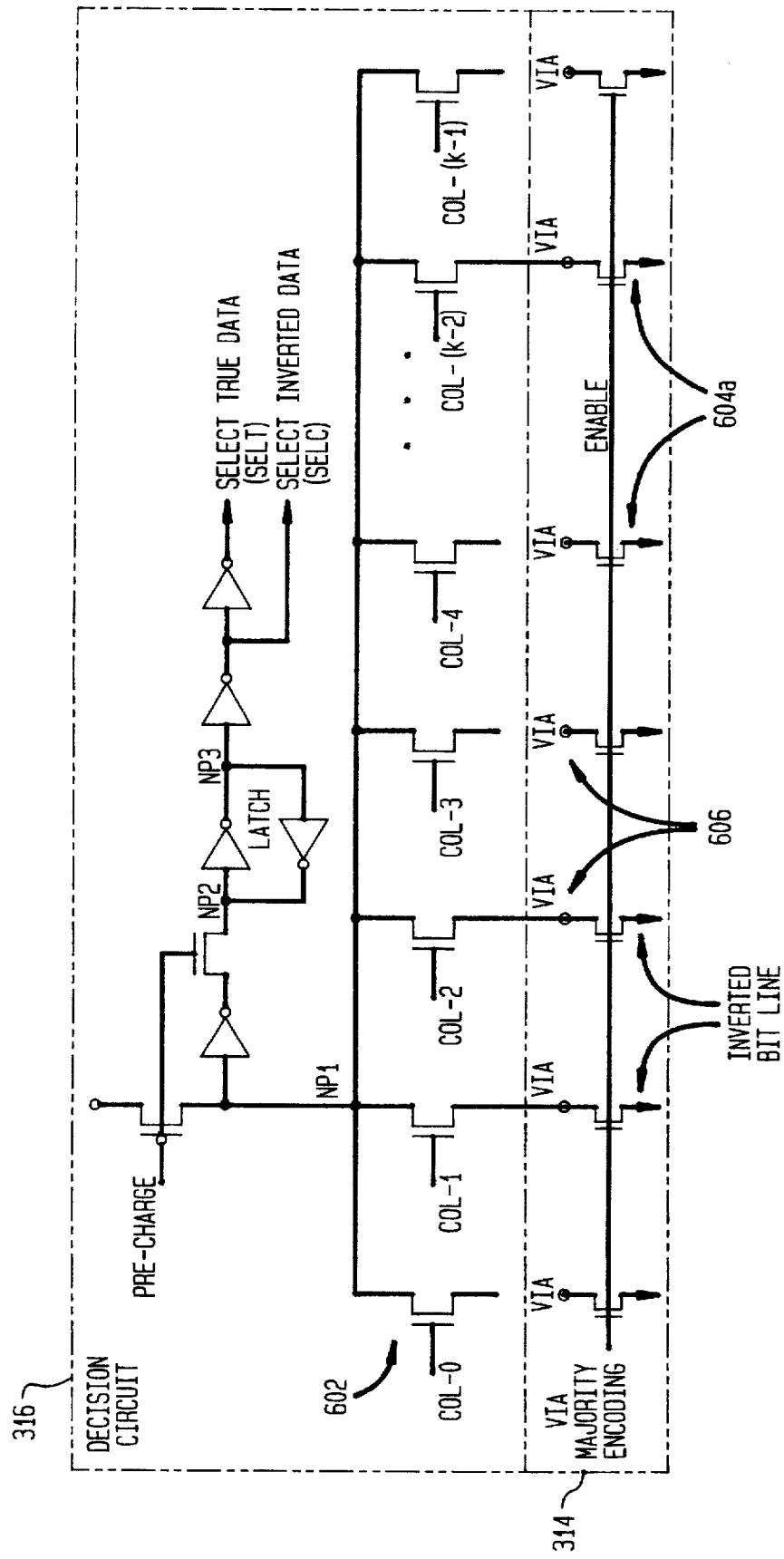

HIGH-SPEED PROGRAMMABLE READ ONLY MEMORY

BACKGROUND OF THE INVENTION

1. Field of the Invention

The present invention relates to computer memory devices, and, in particular, to programmable read only memories.

2. Description of the Related Art

FIG. 1a shows a block diagram of a conventional read only memory (ROM) 100a. Conventional ROM 100a comprises memory array 102a, address precoder 118, row address decoder/driver 106, column address decoder 120, pre-charge device 104, column multiplexer 108, sense amplifier 110, and output buffer and driver 112. Memory array 102a is a two-dimensional array of cells arranged in rows and columns. Information is stored in memory array 102a by selectively programming one or more of the cells in memory array 102a. The rest of the components of ROM 100a operate to read the information out of memory array 102a.

FIG. 1b shows a schematic diagram of a typical via-type implementation (100b) of ROM 100a of FIG. 1a. In via-type ROM 100b, each cell in memory array 102b comprises a transistor, where the source of every transistor is connected to a common node (e.g., ground) and the gate of each transistor is connected to a word line corresponding to the particular transistor row. A cell is programmed by connecting the drain of the cell transistor to a bit line corresponding to the particular transistor column using a via hole. An unprogrammed cell is one whose transistor drain is not connected to the corresponding bit line.

FIG. 1c shows a schematic diagram of a typical thin-oxide (or diffusion) type implementation (100c) of ROM 100a of FIG. 1a. In thin-oxide-type ROM 100c, each programmed cell in memory array 102c comprises a fully connected transistor. That is, the source is connected to the common (ground) node, the gate is connected to the corresponding word line, and the drain is connected to the corresponding bit line. An unprogrammed cell in memory array 102c is essentially an unformed portion of memory array 102c.

In operation, via-type ROM 100b and thin-oxide-type ROM 100c funtion very similarly. In particular, pre-charge device 104 pre-charges the bit lines in the memory array (102b or 102c). Row address decode/driver 106 sequentially turns on and off one row of transistors in the memory array at a time. When a particular word line is turned on (i.e., when voltage is applied to the gates of the transistors in a row of the memory array), if the cell in a given column is a programmed cell, then the corresponding voltage output at the bottom of the memory array will change from its pre-charged value. If the cell is unprogrammed, then the pre-charged value will not change.

Each time a word line is activated, column multiplexer 108 receives one output for each column in the memory array. Column multiplexer 108 serializes those parallel inputs for sense amplifier 110, which samples the voltage signals from column multiplexer 108. Output buffer and driver 112 temporarily stores the voltage signals sampled by sense amplifier 110 for subsequent transmission (e.g., to a CPU memory). In this way, information stored in the memory array can be sequentially read out from the ROM.

The access time of programmable ROMs depends on how fast the programmed cells (i.e., transistors) can discharge the pre-charged bit lines. The bit-line capacitance is proportional to the number of cells that are programmed (i.e., connected to the bit line). The greater the number of programmed cells, the larger the bit-line capacitance, and the longer the access time for the column of cells. Thus, the longest access time is for a column in which all of the cells are connected to the bit line, while the shortest access time is for a column in which only one cell is connected to the bit line.

FIG. 2a shows representations of two different possible columns of via-type memory array 102b of FIG. 1b that demonstrate the extremes in access time. Similarly, FIG. 2b shows representations of two different possible columns of thin-oxide-type memory array 102c of FIG. 1c that demonstrate similar extremes in access time. In columns 202a and 202b, all of the cells are connected to the bit line, while, in columns 204a and 204b, only one cell is connected to the bit line. In either case, the total capacitances for bit line (B/L)-0 and B/L-1 are given by Equations (1) and (2) as follows:

$$C_0 = C_{wire} + C_{diode} \quad (1)$$

$$C_1 = C_{wire} + nC_{diode} \quad (2)$$

where $C_{wire}$ is the wire capacitance of the bit line, $C_{diode}$ is the junction diode capacitance of each transistor, and n is the total number of transistors per column in the memory array. The discharge times for B/L-0 and B/L-1 are given by Equations (3) and (4) as follows:

$$t_0 = \alpha(C_0 V_{DD}/I_{N-ch}) \quad (3)$$

$$t_1 = \alpha(C_1 V_{DD}/I_{N-ch}) \quad (4)$$

where $\alpha$ is a scaling factor (about 2), $V_{DD}$ is the pre-charge bias voltage, and $I_{N-ch}$ is the saturation current of an n-channel cell transistor. For large memory arrays, the maximum settling time $t_1$ is considerably larger than the minimum settling time $t_0$. The longer the settling time, the longer it takes to read information out of the ROM.

SUMMARY OF THE INVENTION

The present invention relates to an integrated circuit and method of use, wherein a read only memory of the integrated circuit comprises a memory array of cells arranged in rows corresponding to word lines and columns corresponding to bit lines, wherein each column of cells may be programmed in a conventional mode or an inverted mode in which each cell that would be programmed in the conventional mode is unprogrammed in the inverted mode and each cell that would be unprogrammed in the conventional mode is programmed in the inverted mode. The ROM device also has an encoder adapted to record whether each column is programmed in the conventional mode or in the inverted mode and an output generator coupled to the encoder and to the memory array, and adapted to generate an output for each column of the memory array based on information recorded in the encoder, wherein a true output is generated if the column is programmed in the conventional mode and a complement of the true output is generated if the column is programmed in the inverted mode.

BRIEF DESCRIPTION OF THE DRAWINGS

Other aspects, features, and advantages of the present invention will become more fully apparent from the following detailed description, the appended claims, and the accompanying drawings in which:

FIGS. 1a–c show configurations of conventional read only memories (ROMs);

FIGS. 6a–b shows schematic diagrams of the decision circuit and two different implementations of the majority encoder of the ROM of FIG. 3.

DETAILED DESCRIPTION

According to the present invention, each column within the memory array of a programmable read only memory (ROM) may be programmed using either a conventional programming mode or an inverted programming mode, which is the opposite of the conventional programing mode. In this way, the maximum number of programmed transistors in a programmed ROM may be limited to half the total number of transistors in each column of the memory array. As such, the maximum total capacitance per column is reduced by a factor of almost two as compared to conventional ROMs. Since lower capacitance means shorter access time, the resulting programmed ROM is up to twice as fast as similarly programmed conventional ROMs.

Figure 1A:
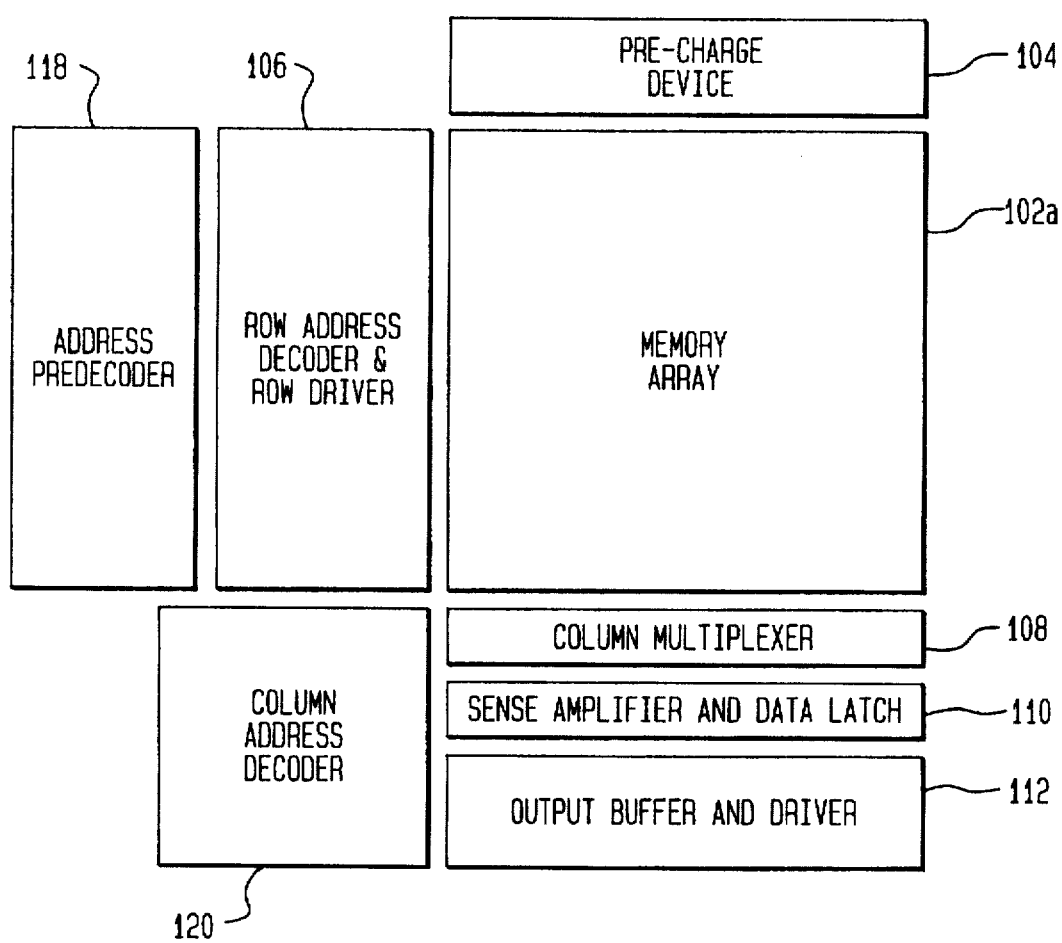
Figure 1C:
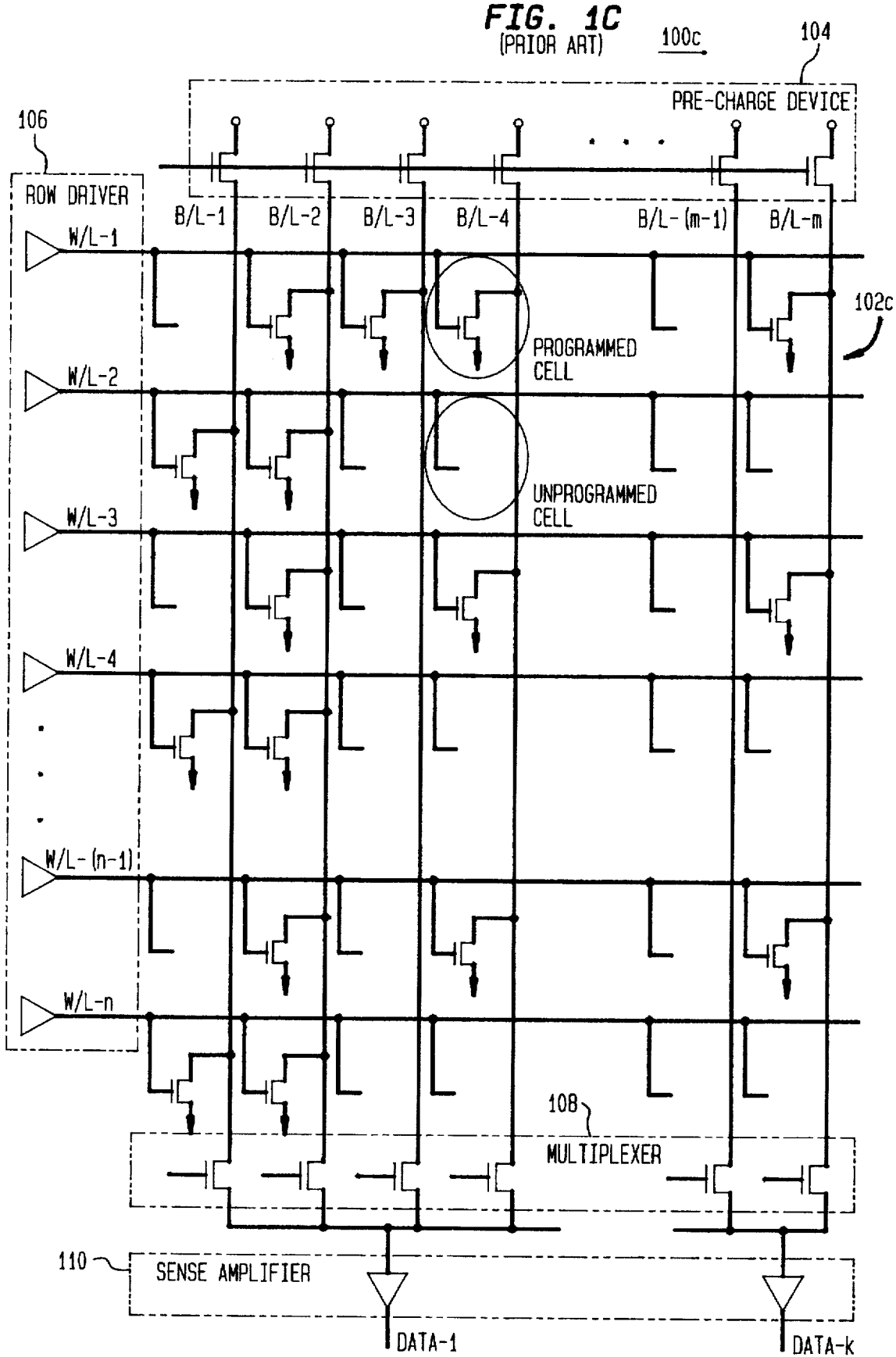
Figure 2A:
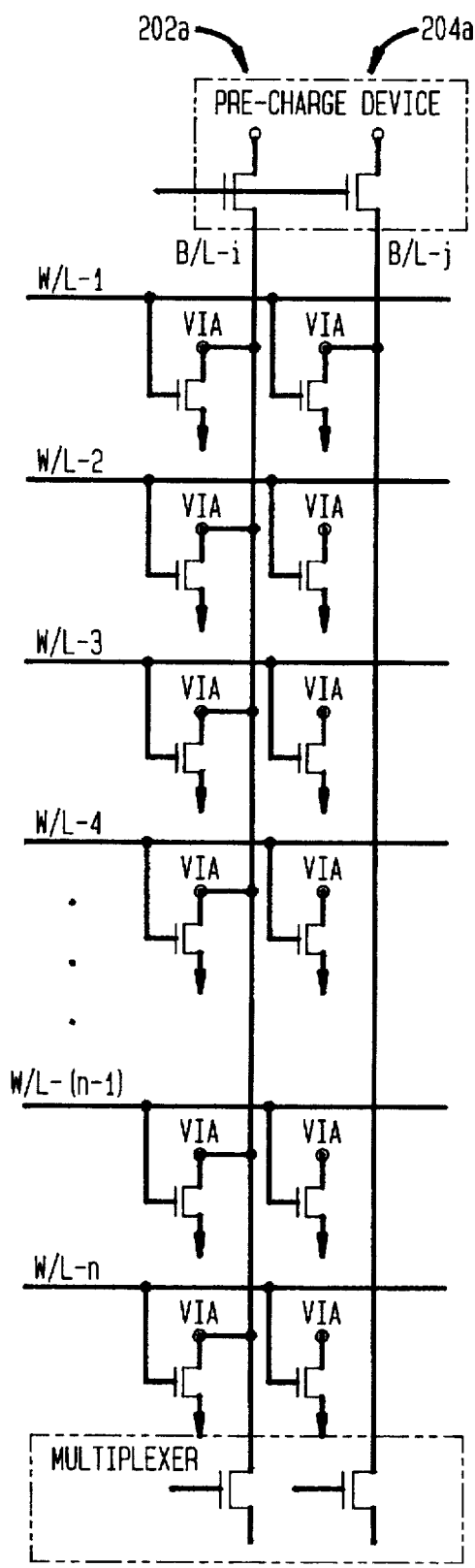
FIGS. 2a–b show representations of two different possible columns of the memory arrays of the ROMs of FIGS. 1b–c that demonstrate the extremes in access time.
Figure 2B:
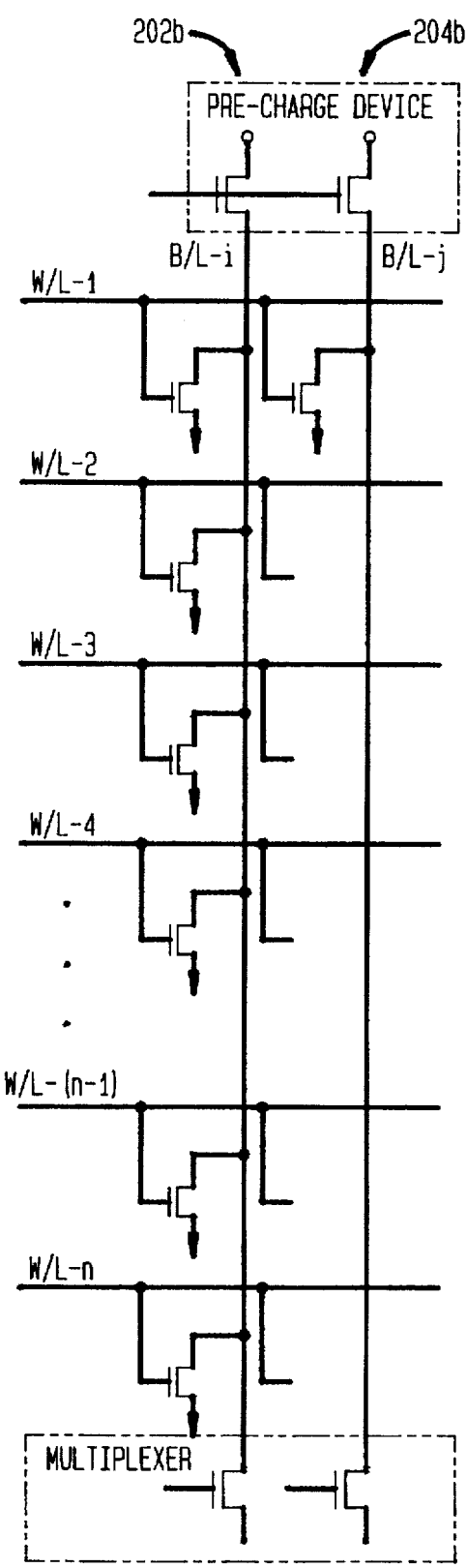
Figure 3:
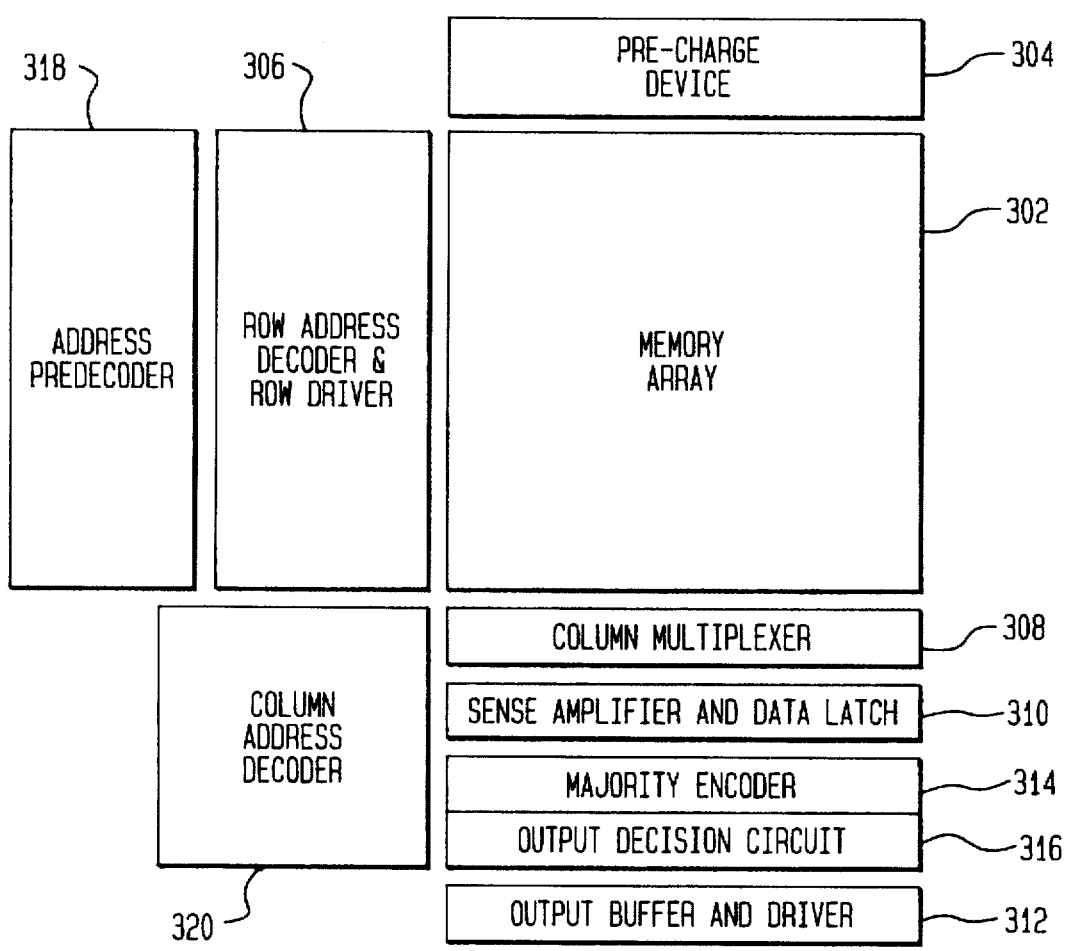
FIG. 3 shows a block diagram of a programmable ROM, according to one embodiment of the present invention.

FIG. 3 shows a block diagram of a programmable ROM 300, according to one embodiment of the present invention. ROM 300 comprises memory array 302, which is analogous to memory array 102a of conventional ROM 100a of FIG. 1a. Depending upon the implementation (e.g., via type or thin-oxide type), ROM 300 may be similar to either memory array 102b of FIG. 1b or memory array 102c of FIG. 1c. It will also be understood that, for alternative types of ROMs (e.g., electronically erasable or flash), memory array 302 may have different programming implementations. For illustrative purposes, the following discussion assumes that ROM 300 is a via-type ROM.

In addition to memory array 302, ROM 300 has precharge device 304, row address decoder/row driver 306, column multiplexer (mux) 308, output buffer and driver 312, address precoder 318, and column address decoder 320, which are respectively analogous to pre-charge device 104, row address decoder/driver 106, column multiplexer 108, output buffer and driver 112, address precoder 118, and column address decoder 120 of ROM 100a. Instead of sense amplifier 110 of ROM 100a, however, ROM 300 has sense amplifier/data latch 310, majority encoder 314, and output decision circuit 316.

According to the present invention, each column of cells in memory array 302 can be programmed independently using either a conventional programming mode or an inverted programming mode. In the conventional programming mode, each transistor that is to be programmed has its drain connected to the corresponding bit line and each transistor that is to be left unprogrammed has its drain left unconnected to the corresponding bit line. This conventional programming mode is the same programming mode applied in ROM 100b of FIG. 1b. In the inverted programming mode, the roles are reversed. If a transistor would be connected to the bit line in the conventional mode, then, in the inverted programming mode, the transistor drain is left unconnected to the bit line (i.e., unprogrammed). Similarly, if a transistor would be left unconnected to the bit line in the conventional mode, then, in the inverted programming mode, the transistor drain is connected to the bit line (i.e., programmed).

The information as to whether a particular column is programmed using the conventional mode or the inverted mode is encoded into majority encoder 314. For each voltage signal generated by column mux 308, sense amplifier/data latch 310 generates two outputs: the true output received from column mux 308 and the complement of the true output received from column mux 308. Based on the information stored in majority encoder 314, output decision circuit 316 selects either the true output or the complement output from sense amplifier/data latch 310 as the correct output from memory array 302 to be temporarily stored in output buffer and driver 312 for subsequent access. That is, if the information stored in majority encoder 314 indicates that the column was programmed using the conventional mode, then output decision circuit 316 selects the true output received from sense amplifier/data latch 310 as the correct output from memory array 302. If, however, the information stored in majority encoder 314 indicates that the column was programmed using the inverted mode, then output decision circuit 316 selects the complement output received from sense amplifier/data latch 310 as the correct output from memory array 302.

As designed, ROM 300 can be programmed selectively to reduce the maximum possible access time for any column in memory array 302. For example, ROM 300 can be programmed according to the following rules:

If, in the conventional programming mode, the number of transistors to be programmed for a given column is less than or equal to half the total number of transistors in the column, then use the conventional programming mode;

Otherwise, use the inverted programming mode for that column.

Each column may be independently programmed using either the conventional mode or the inverted mode. By following this rule, the maximum number of transistors that can be programmed in any column of memory array 302 will be equal to half of the total number of transistors in that column. For example, if, under the conventional programming mode, a particular column were to have 90% of its transistors programmed, then the inverted programming mode would be applied to that column and only 10% of its transistors will actually be connected to the corresponding bit line. As such, the maximum total capacitance (as given by Equation (2)) for any given column is reduced by almost half. Therefore, the average access time for programmed versions of ROM 300 can be reduced by a factor of almost two as compared to similarly programmed versions of conventional ROM 100a of FIG. 1a, thereby resulting in faster ROMs (i.e., greater access speed).

Figure 4A:
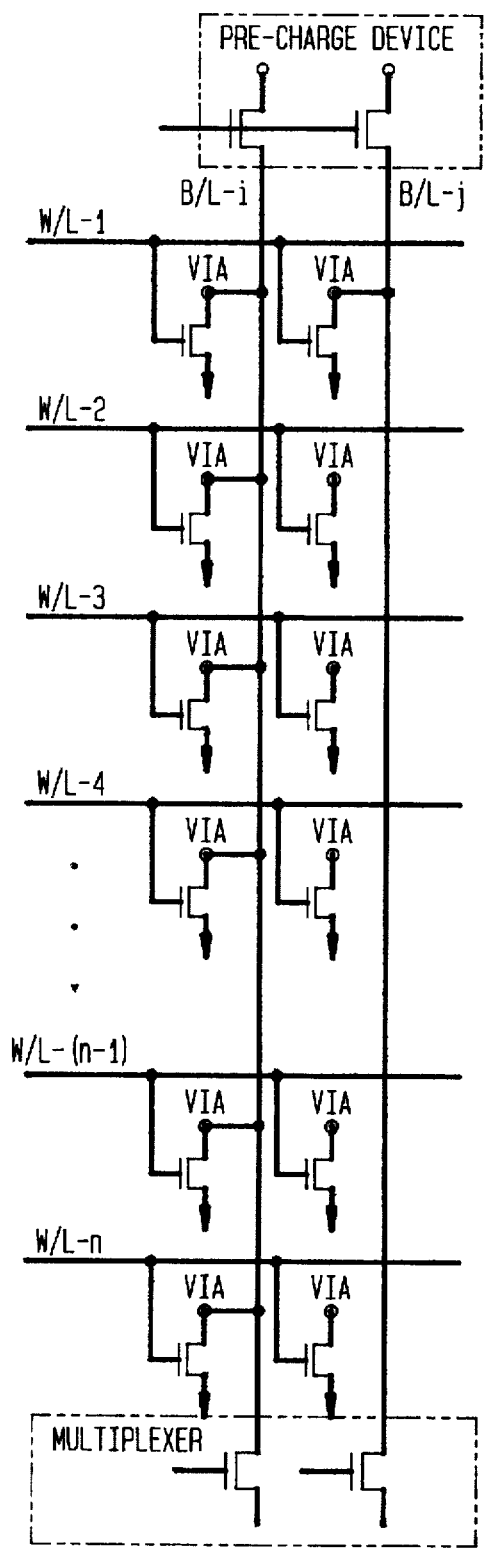
FIGS. 4a–b show an example of column programming according to the present invention.
Figure 4B:
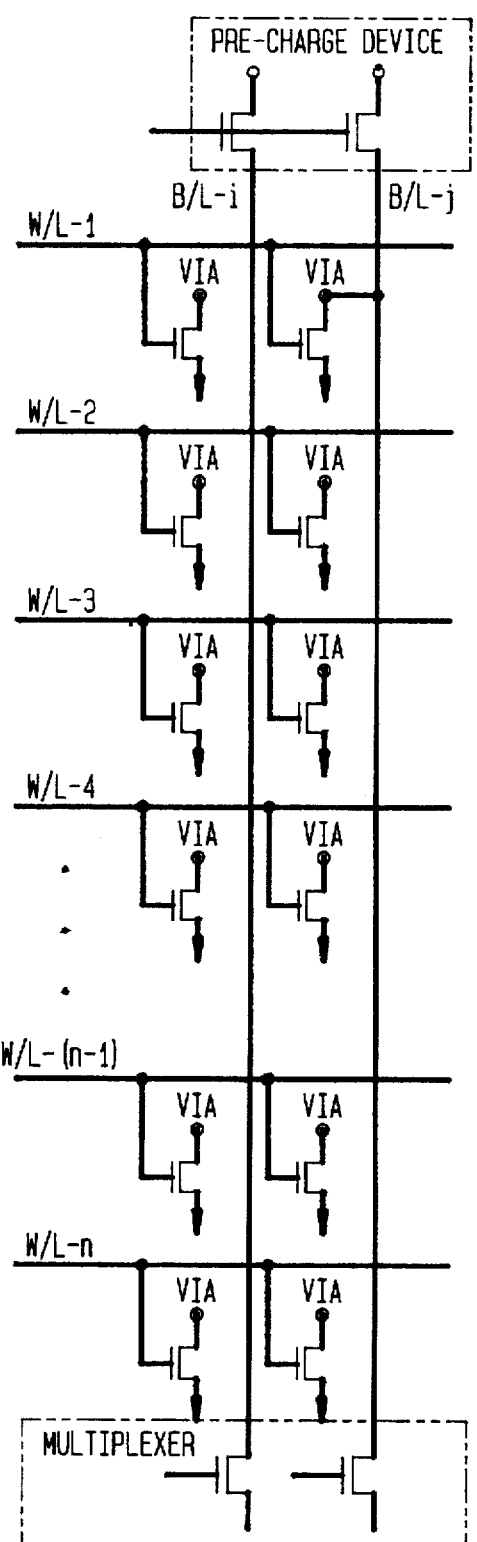

FIGS. 4a–b show an example of column programming according to the present invention. In FIG. 4a, column i has all of its cells programmed, while column j has only one cell programmed. When the above programming rules are applied, it is determined that, since the number of programmed cells in column i is greater than half of the total number of cells per column, column i should be encoded using the inverted programming mode. Similarly, since the number of programmed cells in column j is less than half of the total number of cells per column, column j should be encoded using the conventional programming mode. FIG. 4b shows the actual programming applied to columns i and j, according to one embodiment of the present invention.

Figure 5:
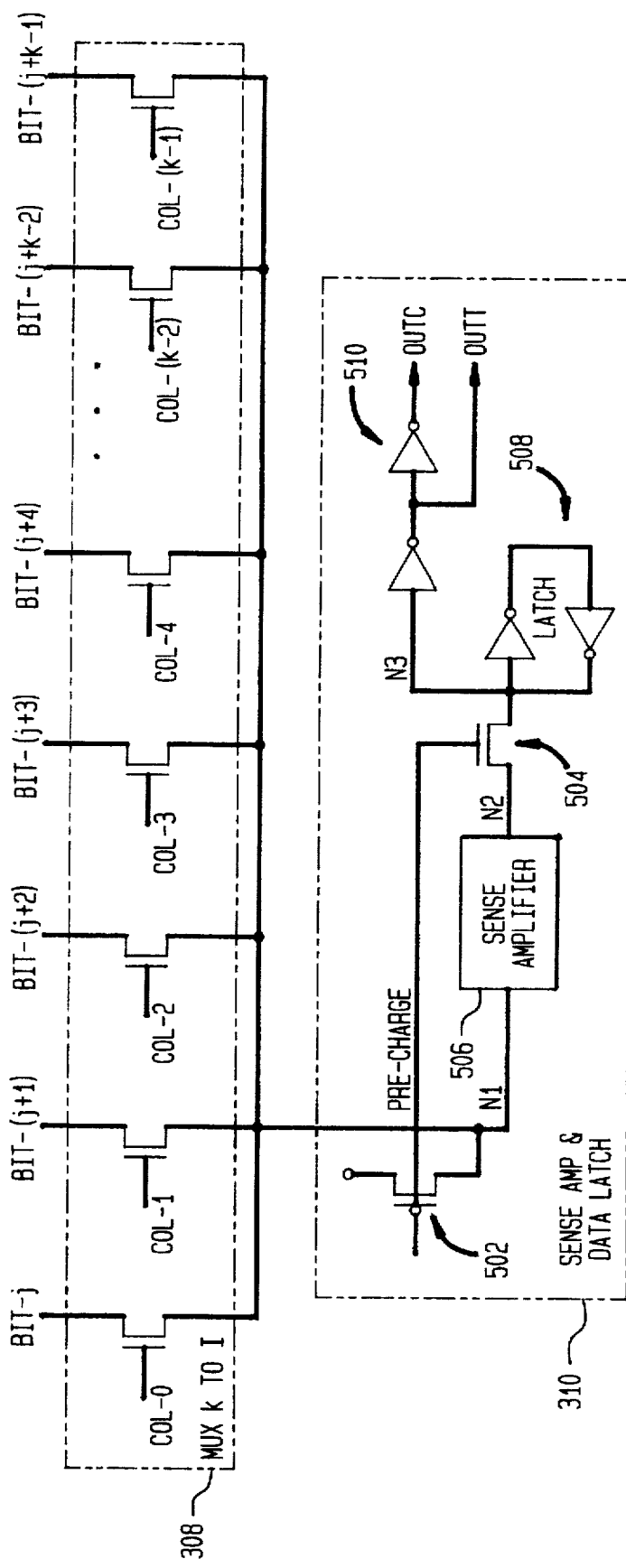
FIG. 5 shows a schematic diagram of the multiplexer and the sense amplifier/latch of the ROM of FIG. 3.

FIG. 5 shows a schematic diagram of column mux 308 and sense amplifier/data latch 310 of ROM 300 of FIG. 3, according to one embodiment of the present invention. Column mux 308 comprises a row of transistors, one for each column in memory array 302 of FIG. 3. The transistors of column mux 308 are selectively turned on and off one at a time to serialize the multiple parallel inputs received from the bit lines of memory array 302. Sense amplifier/data latch 310 sequentially samples and holds the output from column mux 308 and generates two outputs: the true output received from column mux 308 (OUTT) and the complement of the true output received from column mux 308 (OUTC).

In particular, the pre-charge signal of FIG. 5 is used to turn p-channel transistor 502 and n-channel transistor 504 on and off, such that one is on when the other is off, and vice versa. In this way, sense amplifier 506 sequentially samples the output received from column mux 308 and passes the (typically inverted) sampled output through pass-gate transistor 504 to latch 508. Latch 508 holds the previously sampled signal from sense amp 506. Inverters 510 generate the true and complement outputs for each output received from column mux 308.

FIG. 6a shows a schematic diagram of majority encoder 314 and decision circuit 316 of ROM 300 of FIG. 3, according to a via-type embodiment of the present invention. Decision circuit 316 has a multiplexer 602 that is similar to and operates analogously to and in synchronization with column mux 308 of FIGS. 3 and 5. Majority encoder 314 has a set of transistors 604a, where each transistor may or may not be connected to a corresponding transistor of mux 602 by via connector 606. There is one transistor in mux 602 and one corresponding transistor 604a for each column in memory array 302 of FIG. 3. If a particular column of memory array 302 is programmed using the conventional mode, then the corresponding transistor 604a is not connected to the corresponding transistor of mux 602. That is, via connector 606 forms an "open" connection. If, on the other hand, the particular column is programmed using the inverted mode, then the corresponding transistor 604a is connected to the corresponding transistor of mux 602. That is, via connector 606 forms a "closed" connection.

The transistors of mux 602 are turned on and off in synchronization with the transistors of column mux 308 of FIG. 5. For a given column of memory array 302 of FIG. 3, if via connector 606 forms an open connection (indicating that the column was programmed using the conventional mode), then the signal generated at the select true output (SELT) of FIGS. 6a–b will be high and the signal generated at the select complement output (SELC) will be low. Similarly, if connector 606 forms a closed connection (indicating that the column was programmed using the inverted mode), then the signal generated at the select true output (SELT) of FIGS. 6a–b will be low and the signal generated at the select complement output (SELC) will be high. These outputs are then used in output decision circuit 316 to select either the true output or the complement output from sense amplifier/data latch 310 of FIG. 5.

Figure 6B:
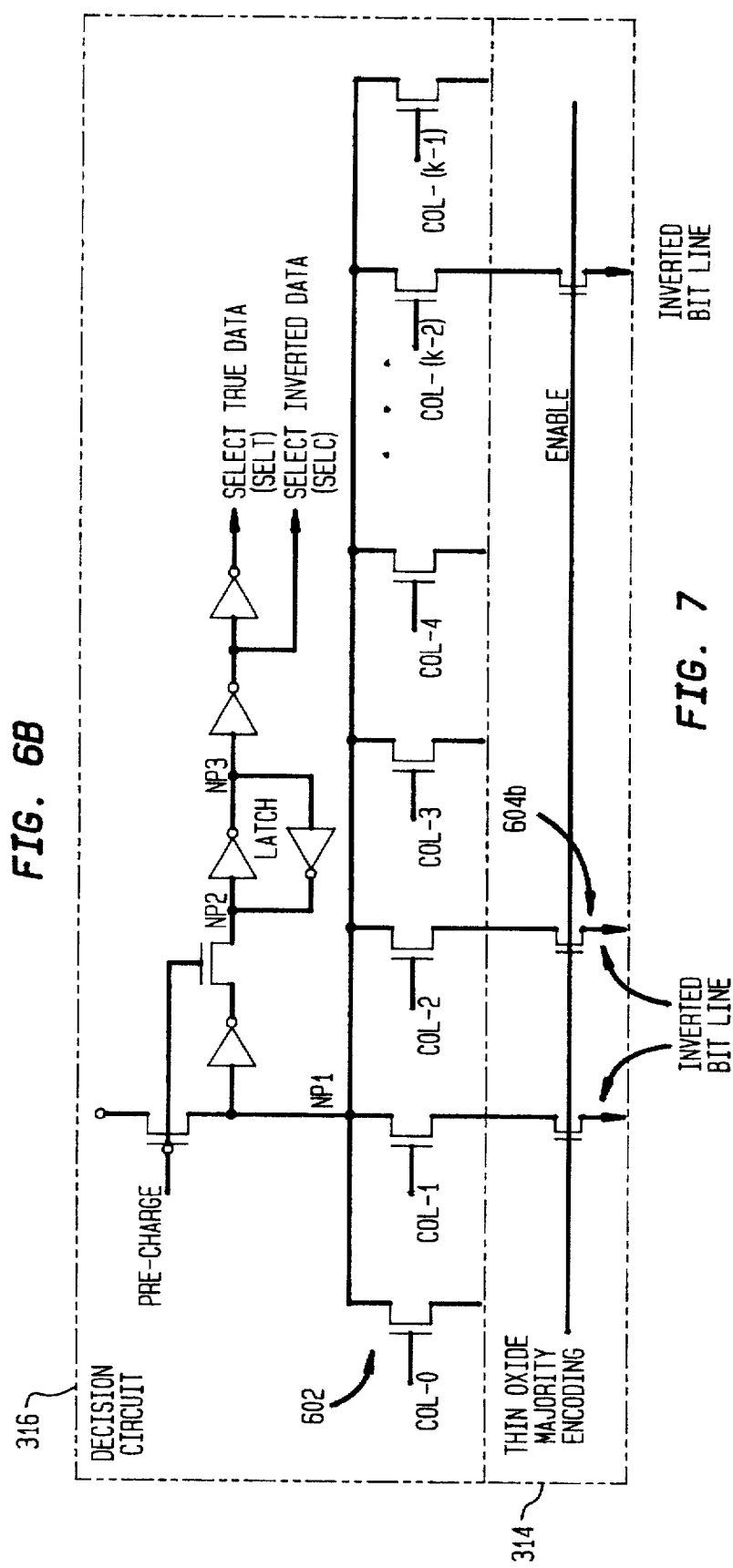

FIG. 6b shows a schematic diagram of majority encoder 314 and decision circuit 316 of ROM 300 of FIG. 3, according to a thin-oxide-type embodiment of the present invention. In this embodiment, the set of transistors 604a and via connectors 606 are replaced by transistors 604b, which are present only when the corresponding column is programmed using the inverted mode.

Figure 7:
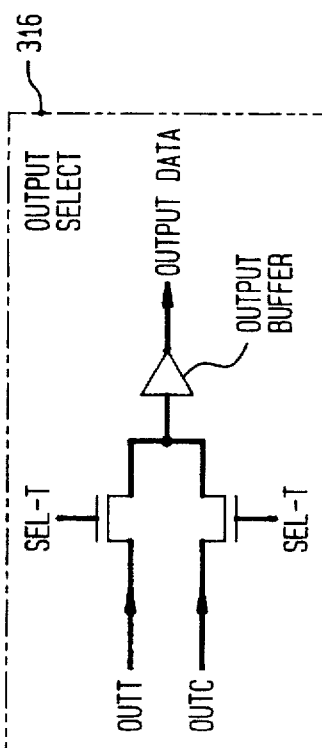
FIG. 7 shows a schematic diagram of the output buffer and driver of the ROM of FIG. 3.

FIG. 7 shows a schematic diagram of output buffer and driver 312 of ROM 300 of FIG. 3, according to a preferred embodiment of the present invention. Output buffer and driver 312 receives the select true output signal (SELT) and the select complement output signal (SELC) from decision circuit 316 of FIGS. 6a–b as well as the true and complement outputs from sense amplifier/data latch 310 of FIG. 5. If SELT is high and SELC is low, then driver 312 the true output as output data from ROM 300. Otherwise, if SELT is low and SELC is high, then output buffer and driver 312 transmits the complement output as output data from ROM 300.

The ROM configuration and associated encoding scheme of the present invention provide faster access time with less variation in access time between bit lines (since the number of transistors programmed per column will vary from 0 to n/2, rather than from 0 to n, as in conventional ROMs). Another advantage of the present invention is lower power dissipation since the total number of transistors that are programmed in each memory array is reduced.

Those skilled in the art will understand that alternative circuit designs may be implemented for storing, accessing, and applying the column-coding-mode information to the information stored in the memory array of ROMs of the present invention. For example, in an alternative implementation, rather than generating both the true output and the complement output for each column and then generating control signals to select between them, the ROM may be designed to generate the complement output only after determining that the column is programmed using the inverted programming mode. Moreover, the process of selecting between the true output and the complement output may be implemented in software rather than hardware.

As used herein the term read only memory (ROM) includes mask programmable ROMs (PROMs), electronically programmable ROMs (EPROMs), electronically erasable programmable ROMs (EEPROMs), and any other form of read only memory.

ROMs of the present invention may be implemented as part of larger integrated circuits that also have other types of devices integrated on a single chip.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a read only memory, comprising:

(a) a memory array of cells arranged in rows corresponding to word lines and columns corresponding to bit lines, wherein each column of cells may be programmed in a conventional programming mode or an inverted programming mode in which each cell that would be programmed in the conventional programming mode is unprogrammed in the inverted programming mode and each cell that would be unprogrammed in the conventional programming mode is programmed in the inverted programming mode;

(b) an encoder adapted to record whether each column is programmed in the conventional programming mode or in the inverted programming mode; and (c) an output generator coupled to the encoder and to the memory array, and adapted to generate an output for each column of the memory array based on information recorded in the encoder, wherein a true output is generated if the column is programmed in the conventional programming mode and a complement of the true output is generated if the column is programmed in the inverted programming mode.

2. The integrated circuit of claim 1, wherein:

the memory array is a via-type memory array; and the encoder comprises:

(i) a transistor and an open via connector for each column of the memory array programmed using the conventional programming mode; and (ii) a transistor and a closed via connector for each column of the memory array programmed using the inverted programming mode, wherein the closed via connector connects the transistor to the output generator.

3. The integrated circuit of claim 1, wherein:

the memory array is a thin-oxide-type memory array; and the encoder comprises a transistor for each column of the memory array programmed using the inverted programming mode, wherein the transistor is connected to the output generator.

4. The integrated circuit of claim 1, wherein the output generator comprises:

(1) a column multiplexer adapted to serialize the outputs from the columns of the memory array;

(2) a sense amplifier/data latch circuit adapted to generate the true output and the complement output for each output received from the column multiplexer;

(3) an output decision circuit adapted to generate output selection signals based on the information stored in the encoder; and (4) an output buffer and driver adapted to select between the true output and the complement output based on the output selection signals from the output decision circuit.

5. The integrated circuit of claim 4, wherein:

the memory array is a via-type memory array; and the encoder comprises:

(i) a transistor and an open via connector for each column of the memory array programmed using the conventional programming mode; and (ii) a transistor and a closed via connector for each column of the memory array programmed using the inverted programming mode, wherein the closed via connector connects the transistor to a corresponding transistor in a multiplexer of the output decision circuit.

6. The integrated circuit of clam 4, wherein:

the memory array is a thin-oxide-type memory array; and the encoder comprises a transistor for each column of the memory array programmed using the inverted programming mode, wherein the transistor is connected to a corresponding transistor in a multiplexer of the output decision circuit.

7. A method for programming an integrated circuit having a read only memory having a memory array of cells arranged in rows corresponding to word lines and columns corresponding to bit lines, comprising the steps of:

(a) programming one or more columns of the memory array using a conventional programming mode; and (b) programming one or more other columns of the memory array using an inverted programming mode in which each cell that would be programmed in the conventional programming mode is unprogrammed in the inverted programming mode and each cell that would be unprogrammed in the conventional programming mode is programmed in the inverted programming mode.

8. The method of claim 7, further comprising the step of encoding into an encoder of the read only memory wherein each column is programmed using the conventional programming mode or the inverted programming mode.

9. The method of claim 7, wherein a column is programmed using the conventional programming mode if no more than half of the cells in the column are to be programmed, otherwise programming the column using the inverted programming mode.

10. A method for reading data stored in an integrated circuit having a read only memory having a memory array of cells arranged in rows corresponding to word lines and columns corresponding to bit lines, comprising the steps of:

(a) generating true output data for each column in the memory array programmed using a conventional programming mode; and (b) generating complement output data for each column in the memory array programmed using an inverted programming mode in which each cell that would be programmed in the conventional programming mode is unprogrammed in the inverted programming mode and each cell that would be unprogrammed in the conventional programming mode is programmed in the inverted programming mode.

11. The method of claim 10, wherein steps (a) and (b) comprise the steps of:

(1) generating a true output and a complement output for each column in the memory array;

(2) selecting between the true output and the complement output based on information stored in an encoder of the read only memory that identifies whether each column is programmed using the conventional programming mode or the inverted programming mode.

* * * * *